United States Patent
Yoo

(10) Patent No.: US 11,056,508 B2
(45) Date of Patent: Jul. 6, 2021

(54) FERROELECTRIC MEMORY DEVICE

(71) Applicant: SK hynix Inc., Icheon-si (KR)

(72) Inventor: Hyangkeun Yoo, Icheon-si (KR)

(73) Assignee: SK HYNIX INC., Icheon-si (KR)

(*) Notice: Subject to any disclaimer, the term of this patent is extended or adjusted under 35 U.S.C. 154(b) by 154 days.

(21) Appl. No.: 16/016,605

(22) Filed: Jun. 24, 2018

(65) Prior Publication Data
US 2019/0019802 A1 Jan. 17, 2019

(30) Foreign Application Priority Data
Jul. 14, 2017 (KR) .......... 10-2017-0089922

(51) Int. Cl.
H01L 27/1159 (2017.01)
H01L 29/51 (2006.01)
H01L 29/78 (2006.01)
H01L 29/423 (2006.01)
G11C 11/22 (2006.01)

(52) U.S. Cl.
CPC ........ H01L 27/1159 (2013.01); G11C 11/223 (2013.01); G11C 11/2273 (2013.01); G11C 11/2275 (2013.01); H01L 29/42364 (2013.01); H01L 29/513 (2013.01); H01L 29/516 (2013.01); H01L 29/517 (2013.01); H01L 29/78391 (2014.09)

(58) Field of Classification Search
CPC ........... H01L 27/112; H01L 27/115; H01L 27/11502; H01L 27/11507; H01L 27/11517; H01L 27/11521; H01L 27/11585; H01L 27/1159; H01L 29/4011; H01L 29/40111; H01L 29/42312; H01L 29/4232; H01L 29/42364; H01L 29/51; H01L 29/511; H01L 29/513; H01L 29/516; H01L 29/517; H01L 29/66477; H01L 29/6684; H01L 29/78; H01L 29/78391; G11C 11/223; G11C 11/2273; G11C 11/2275
See application file for complete search history.

(56) References Cited

U.S. PATENT DOCUMENTS

| | | | | |
|---|---|---|---|---|
| 6,133,051 A | * | 10/2000 | Hintermaier | C04B 35/18 257/E21.272 |
| 6,140,173 A | | 10/2000 | Wolters et al. | |
| 6,518,070 B1 | | 2/2003 | Alluri et al. | |
| 10,033,383 B1 | * | 7/2018 | Richter | H03K 19/0013 |
| 2014/0070289 A1 | * | 3/2014 | Tanaka | H01L 29/516 257/295 |
| 2017/0345831 A1 | * | 11/2017 | Chavan | H01L 29/40111 |

* cited by examiner

Primary Examiner — Cheung Lee

(57) ABSTRACT

A ferroelectric memory device according to an embodiment includes a substrate, a ferroelectric layer and a gate electrode layer that are sequentially stacked on the substrate, and an oxygen vacancy barrier layer disposed at least between the substrate and the ferroelectric layer or between the ferroelectric layer and the gate electrode layer. The oxygen vacancy barrier layer includes a metal oxide with formula unit components that satisfy a stoichiometric ratio.

16 Claims, 6 Drawing Sheets

FERROELECTRIC MEMORY DEVICE

CROSS-REFERENCE TO RELATED APPLICATION

The present application claims priority under 35 U.S.C 119(a) to Korean Patent Application No. 10-2017-0089922, filed on Jul. 14, 2017, which is herein incorporated by reference in its entirety.

BACKGROUND

1. Technical Field

Various embodiments of the present disclosure generally relate to a semiconductor device, and more particularly, relate to a ferroelectric memory device.

2. Related Art

Generally, a ferroelectric material refers to a material having spontaneous electrical polarization in a state in which no external electric field is applied. In addition, a ferroelectric material can be controlled to maintain one of two stable remanent polarization states on a ferroelectricity hysteresis curve by an externally applied electric field. Such property can be utilized to store logic information of "0" or "1" in a nonvolatile manner.

Recently, a ferroelectric memory device in the form of a field effect transistor in which a ferroelectric material is used in a gate dielectric layer has been studied. A write operation of the memory device may be performed by applying a predetermined write voltage to a gate electrode layer and recording different remanent polarization states in the gate dielectric layer as logic information. A read operation of the memory device may be performed by reading an operating current passing through a channel layer of the field effect transistor. The channel resistance of the field effect transistor changes depending on the different remanent polarization states recorded in the gate dielectric layer.

SUMMARY

There is disclosed a ferroelectric memory device according to one aspect of the present disclosure. The ferroelectric memory device includes a substrate, a ferroelectric layer and a gate electrode layer that are sequentially stacked on the substrate, and an oxygen vacancy barrier layer. The oxygen barrier layer may be disposed at least between the substrate and the ferroelectric layer or between the ferroelectric layer and the gate electrode layer. The oxygen vacancy barrier layer includes a metal oxide with formula unit components that satisfy a stoichiometric ratio.

There is disclosed a ferroelectric memory device according to another aspect of the present disclosure. The ferroelectric memory device includes a substrate, a ferroelectric metal oxide and a gate electrode layer that are sequentially stacked on the substrate, and an oxygen vacancy barrier layer. The oxygen barrier layer may be disposed at least between the substrate and the ferroelectric layer or between the ferroelectric layer and the gate electrode layer.

DETAILED DESCRIPTION

Figure 1:
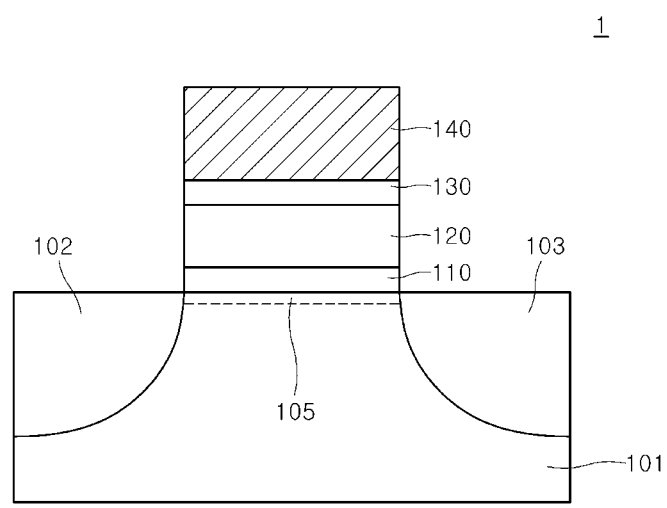
FIG. 1 is a cross-sectional view schematically illustrating a ferroelectric memory device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof. Further, in performing a method or a manufacturing method, each process constituting the method can take place differently from the stipulated order unless a specific sequence is described explicitly in the context. In other words, each process may be performed in the same manner as stated order, may be performed substantially at the same time, or may be performed in a reverse order.

FIG. 1 is a cross-sectional view schematically illustrating a ferroelectric memory device 1 according to an embodiment of the present disclosure. Referring to FIG. 1, the ferroelectric memory device 1 may include a substrate 101, a first oxygen vacancy barrier layer 110, a ferroelectric layer 120, a second oxygen vacancy barrier layer 130, and a gate electrode layer 140. The ferroelectric memory device 1 may be a transistor-type device having different channel resistances depending on a polarization orientation stored in the ferroelectric layer 120.

The ferroelectric memory device 1 described in this embodiment may perform a memory operation as follows. In connection with a writing operation, when a predetermined or known writing voltage is applied through the gate electrode layer 140, a polarization orientation with a particular magnitude and direction may be generated in the ferroelectric layer 120. After the writing voltage is removed, a remanent polarization having the same orientation is retained in the ferroelectric layer 120. The retained remanent polarization corresponds to a stored logic information. As a non-limiting example, a remanent polarization having an orientation from the gate electrode layer 140 toward the substrate 101 can store logic information of "0", while a remanent polarization having an orientation from the substrate 101 toward the gate electrode layer 140 can store logic information of "1".

Meanwhile, the remanent polarization in ferroelectric layer 120 can induce electric charges such as electrons or holes to move into or out of a channel region 105 in the substrate 101. In connection with a reading operation, when a reading voltage is applied to the gate electrode layer 140, a channel resistance between a source region 102 and a drain region 103 may vary depending on the type, amount and the like of the charges in the channel region 105, including charges present under the influence of the remanent polarization in ferroelectric layer 120. As an example, when the information '0' is stored, electrons are induced into the channel region 105 by the corresponding remanent polarization, so that the channel resistance can be relatively decreased in a reading operation, and a larger current can be measured. In a contrasting example, when the information of "1" is stored, electrons are ejected or repelled from the channel region 105 due to the corresponding remanent polarization, so that the channel resistance can be relatively increased in the reading operation, and the measured current is lower. Thus, the logic information stored in the ferroelectric memory device 1 can also be determined by measuring the change in the channel resistance. Different channel resistances are possible depending on the strength of the remanent polarization in ferroelectric layer 120.

The substrate 101 may include, for example, a semiconductor material. The substrate 101 may, for example, be a silicon (Si) substrate, a gallium arsenide (GaAs) substrate, an indium phosphide (InP) substrate, a germanium (Ge) substrate, or a silicon germanium (SiGe) substrate, as non-limiting examples. In an embodiment, the substrate 101 may be doped to have conductivity. As an example, the substrate 101 may be doped with a p-type dopant. As another example, the substrate 101 may have a p-type doped region beneath a ferroelectric structure 10.

The source region 102 and the drain region 103 may be disposed in the substrate 101 to be spaced apart from each other. The source region 102 and the drain region 103 may be disposed at opposite ends of the gate electrode layer 140 or opposite ends of the channel region 105. In an embodiment, each of the source region 102 and the drain region 103 may be an n-type doped region.

The ferroelectric layer 120 may be disposed on the substrate 101. The ferroelectric layer 120 may include a ferroelectric material having remanent polarization therein. In an embodiment, the remanent polarization can attract electrons into the channel region 105 of the substrate 101. When a reading operation is performed, the channel resistance between the source region 102 and the drain region 103 is governed by the density of electrons, including the induced electrons, the channel region 105. The ferroelectric layer 120 may have a thickness of about five (5) nanometers (nm) to fifteen (15) nm, for example.

In an embodiment, the ferroelectric layer 120 may include a crystalline metal oxide. The ferroelectric layer 120 may include a binary metal oxide. The ferroelectric layer 120 may include, for example, hafnium oxide, zirconium oxide, or a combination thereof. In another embodiment, the ferroelectric layer may include a ternary or higher metal oxide. The ferroelectric layer 120 may include, for example, $Pb(Zr, Ti)O_3$, $SrBi_2Ta_2O_9(Bi,La)_4Ti_3O_{12}$, $BiFeO_3$, or a combination of two or more thereof.

In an embodiment, the ferroelectric layer 120 may include at least one dopant. When the ferroelectric layer 120 includes a binary metal oxide, the ferroelectric layer 120 may include a dopant comprising an element with two (2) to four (4) valence electrons, i.e., a dopant having a valence of two (2) to four (4). As an example, the ferroelectric layer 120 may include carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof.

The dopant distributed in the ferroelectric layer 120 can stabilize the ferroelectricity of the ferroelectric layer 120. In some embodiments, when the ferroelectric layer 120 includes metal oxide, the dopant may induce strain or stress into the crystal structure of the metal oxide such that the dopant may help the metal oxide have a ferroelectric crystalline structure in the ferroelectric layer 120. However, the dopant may react with oxygen in the metal oxide and form an incomplete bond between the dopant and the oxygen. The reaction leads to formation of an oxygen vacancy with an overall positive charge. As an example, the dopant may have a valence different from the valence of a metal in the metal oxide, resulting in a non-stoichiometric metal oxide and oxygen vacancies. Oxygen vacancies with positive electric charge can flow in the ferroelectric layer 120 consistent with an electric field formed by a voltage applied to gate electrode layer 140.

Under the influence of the generated electric field, oxygen vacancies may move towards an interface between the ferroelectric layer 120 and the substrate 101, or towards an interface between the ferroelectric layer 120 and the gate electrode layer 140, depending on the nature of the externally applied voltage. The oxygen vacancies that migrate to an interface with either the substrate 101 or the gate electrode layer 140 act as defects, such as trap sites for electric charges and the like. Accordingly, the oxygen vacancies may enhance leakage current from the substrate 101 or the gate electrode layer 140 into the ferroelectric layer 120. Leakage current promotes deterioration of the remanent polarization in derogation of data retention stability. In addition, when external voltages with opposite polarities or bias, and varying in magnitude, are repeatedly applied to the ferroelectric memory device 1 over multiple write and reset cycles, oxygen vacancy migration in ferroelectric layer 120 between the substrate 101 and the gate electrode layer 140 may lower the operating life of the ferroelectric memory device through fatigue. Therefore, production of oxygen vacancies in the ferroelectric layer 120 may result in the weakened operational reliability of the ferroelectric memory device 1.

The gate electrode layer 140 may be disposed on the ferroelectric layer 120. The gate electrode layer 140 may include a conductive material. The gate electrode 140 may include, for example, tungsten (W), titanium (Ti), copper (Cu), aluminum (Al), platinum (Pt), iridium (Ir), ruthenium (Ru), tungsten nitride, titanium nitride, tantalum nitride, iridium oxide, ruthenium oxide, tungsten carbide, titanium carbide, tungsten silicide, titanium silicide, tantalum silicide, or a combination of two or more thereof.

Referring again to FIG. 1, a first oxygen vacancy barrier layer 110 may be disposed between the substrate 101 and the ferroelectric layer 120. The first oxygen vacancy barrier layer 110 may include a crystalline metal oxide having formula units that satisfy a stoichiometric ratio, i.e., neutral chemical compounds whose formula compositions be expressed in integers. Thus, the generation of crystal defects inside the first oxygen vacancy barrier layer 110 is lowered or effectively eliminated in comparison to a layer including a non-stoichiometric metal oxide. As an example, the concentration of oxygen vacancies in the first oxygen vacancy barrier layer 110 may be lower than the concentration of oxygen vacancies in the ferroelectric layer 120.

As described above, the first oxygen vacancy barrier layer 110 acts as a migration barrier between oxygen vacancies in the ferroelectric layer 120 and the substrate 101, despite any migration of oxygen vacancies in the ferroelectric layer 120 due to the voltage applied to the gate layer 140 during the operation of ferroelectric memory device 1. Oxygen vacancies can move along incomplete defect sites in a material layer, and therefore because first oxygen vacancy barrier layer 110 has fewer defects because it uses metal oxide that satisfies a stoichiometric ratio, oxygen vacancy does not continue to migrate through the barrier layer 110. Accordingly, the first oxygen vacancy barrier layer 110 tends to block oxygen vacancies from aggregating at an interface with the substrate 101 and augmenting any leakage current that can worsen data retention. In addition, utilization of the first oxygen vacancy barrier layer 110 reduces wear and tear of the ferroelectric memory device 1 when external voltages having different polarities are repeatedly applied in a plurality of cycles by preventing repeated cyclical migration of oxygen vacancies.

In an embodiment, the first oxygen vacancy barrier layer 110 may include binary metal oxide. The first oxygen vacancy barrier layer 110 may include, for example, hafnium oxide, zirconium oxide, titanium oxide, or a combination of two or more thereof.

In an embodiment, the first oxygen vacancy barrier layer 110 may have an un-doped state, in which dopant is not implanted intentionally into the layer. As a result, incomplete chemical bonding between any dopant and oxygen within the first oxygen vacancy barrier layer 110 is avoided because the first oxygen vacancy barrier layer 110 have no dopants. That is, oxygen vacancies generated by the dopant may be suppressed in the first oxygen vacancy barrier layer 110. The first oxygen vacancy barrier layer 110 may have a thickness of about one (1) nm to two (2) nm.

In another embodiment, the first oxygen vacancy barrier layer 110 includes a dopant with a valence equal to the valence of a metal contained in the binary metal oxide. As an example, when the first oxygen vacancy barrier layer 110 includes tetravalent metal oxide such as hafnium oxide, zirconium oxide, titanium oxide and the like, the first oxygen vacancy barrier layer 110 may include a tetravalent dopant doped into the metal oxide. As an example, the first oxygen vacancy barrier layer 110 may include silicon (Si), zirconium (Zr), germanium (Ge), tin (Sn), lead (Pb), titanium (Ti), or a combination of two or more thereof as a dopant. The dopant may be located at or near a site of a metal in the binary metal oxide. Because the dopant and a metal of the metal oxide have the same valence, incomplete chemical bond between the metal and oxygen in the metal oxide is inhibited or reduced relative to material layers with dopants and metals of different valences.

In an embodiment, the first oxygen vacancy barrier layer 110 and the ferroelectric layer 120 may include the same metal oxide that has the same metal-oxygen bonds. As an example, the first oxygen vacancy barrier layer 110 and the ferroelectric layer 120 may include the same chemical compositions. As another example, the first oxygen vacancy barrier layer 110 and the ferroelectric layer 120 may include the same chemical compositions having the same stoichiometric ratio. When the first oxygen vacancy barrier layer 110 includes the same metal oxide as that used in the ferroelectric layer 120, the magnitude of any depolarization electric field generated at the interface between the ferroelectric layer 120 and the first oxygen vacancy barrier layer 110 may be diminished, in comparison to a depolarization electric field at an interface between layers that utilize different metal oxides. A depolarization electric field is an electric field at an interface, between the ferroelectric layer 120 having a ferroelectric property and a layer having a different dielectric property (e.g. non-ferroelectric property), that cancels or reverses the polarization in the ferroelectric layer 120. Accordingly, the choice of metal oxides used in layers of the ferroelectric memory device 1 supports the reliability of data retention therein by controlling or reducing the possibility of depolarization in the ferroelectric layer 120.

In addition, when the first oxygen vacancy barrier layer 110 is formed of the same material that has the same metal-oxygen bonds as the ferroelectric layer 120, the concentration or number of crystalline oxide defects generated at the interface between the ferroelectric layer 120 and the first oxygen vacancy barrier layer 110 can be moderated or eliminated. Fewer defects tend to lessen or stop leakage current destabilizing remanent polarization in the ferroelectric layer 120.

In an embodiment, the first oxygen vacancy barrier layer 110 may have ferroelectricity. At this time, the first oxygen vacancy barrier layer 110 may or may not have a dopant therein. As an example, the first oxygen vacancy barrier layer 110 may have a binary metal oxide that contributes to the layer's ferroelectric properties. When the first oxygen vacancy barrier layer 110 has ferroelectricity, it can also have a high dielectric constant. A high dielectric constant may mean a dielectric constant that is higher than that of a silicon oxide layer, which is conventionally used as an interfacial insulating layer between a substrate and a ferroelectric layer. When the first oxygen vacancy barrier layer 110 has a high dielectric constant, fewer charge traps form at the interface between the substrate 101 and the first oxygen vacancy barrier layer 110, which cuts down the occurrence or magnitude of leakage current.

Referring again to FIG. 1, a second oxygen vacancy barrier layer 130 may be disposed between the ferroelectric layer 120 and the gate electrode layer 140. The second oxygen vacancy barrier layer 130 may include a crystalline metal oxide having molecular units that satisfy a stoichiometric ratio, i.e., neutral formula units whose chemical compositions are expressed in integers. Thus, the generation of a crystal defect in the second oxygen vacancy barrier layer 130 is lowered or effectively eliminated in comparison to a layer including a non-stoichiometric metal oxide.

The second oxygen vacancy barrier layer 130 acts as a migration barrier between oxygen vacancies in the ferroelectric layer 120 and the gate electrode layer 140, regardless of any migration of oxygen vacancies in the ferroelectric layer 120 resulting from the voltage applied to the gate electrode layer 140 during operation of ferroelectric memory device 1. Accordingly, it is possible to prevent oxygen vacancies from collecting at or near an interface with gate electrode layer 140 and contributing to a leakage current that deteriorates data retention or storage. In addition, reduction of operational life due to the diminished endurance of ferroelectric memory device 1 caused by the oxygen vacancies at the interfaces, when external voltages having different polarities are repeatedly applied in a plurality of cycles, is also limited by inhibiting repeated cyclical migration of oxygen vacancies.

A configuration of the second oxygen vacancy barrier layer 130 may be substantially the same as a configuration of the first oxygen vacancy barrier layer 110. That is, the second oxygen vacancy barrier layer 130 may include a binary metal oxide. In an embodiment, the second oxygen vacancy barrier layer 130 may have an un-doped state. In another embodiment, the second oxygen vacancy barrier layer 130 may have a dopant having a valence of the same value as the valence of a metal in the binary metal oxide.

As described above, the ferroelectric memory device 1 according to an embodiment of the present disclosure includes the oxygen vacancy barrier layers 110 and 130, so that the reliability of device in terms of data retention, operation, and operational life, can be improved.

Figure 2:
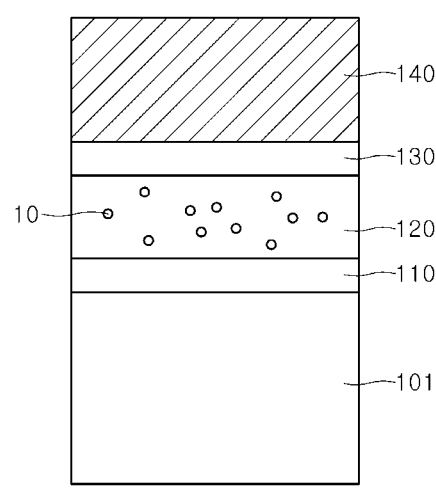
FIGS. 2 to 4 are views schematically illustrating a method of operating a ferroelectric memory device according to an embodiment of the present disclosure.
Figure 3:
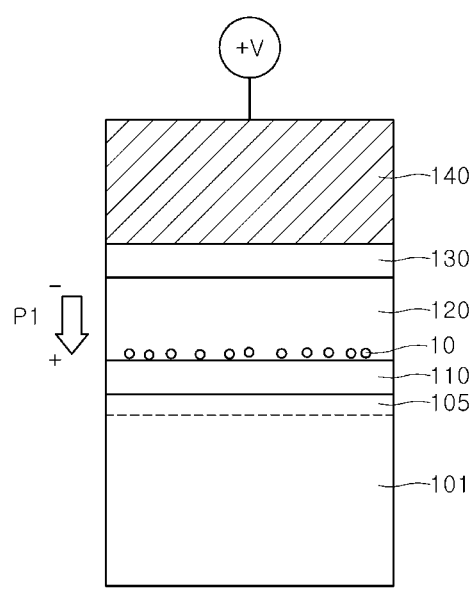
Figure 4:
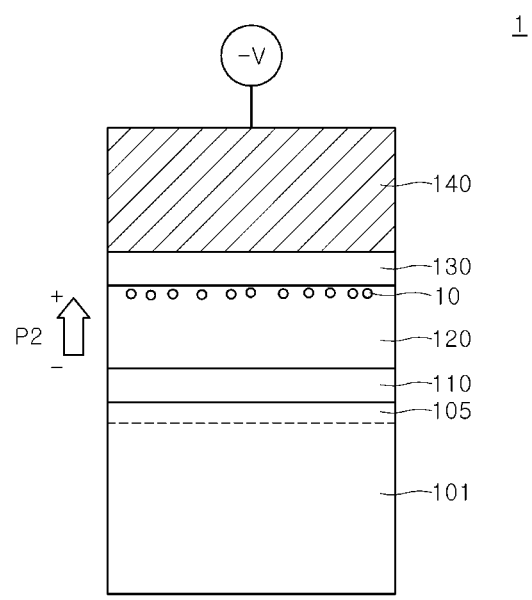

FIGS. 2 to 4 are views schematically illustrating an operating method of a ferroelectric memory device 1 according to an embodiment of the present disclosure. The operating method of the ferroelectric memory device 1 illustrated in FIGS. 2 to 4 may be performed using a ferroelectric memory device 1 described above and with reference to FIG. 1. For convenience of description, the source and drain regions 102 and 103 in the substrate 101 of FIG. 1 are omitted from FIGS. 2 to 4.

Referring to FIG. 2, in an initial state after the ferroelectric memory device 1 is manufactured, oxygen vacancies 10 may be distributed in a ferroelectric layer 120 at a predetermined or designated concentration or distribution. The oxygen vacancies 10 can be generated by an incomplete bond within molecular units that do not satisfy a stoichiometric ratio between metal and oxygen that could result in a perfect crystalline lattice structure in ferroelectric layer 120, as described above. When the ferroelectric layer 120 is doped with a dopant, the dopant may further increase the concentration of the oxygen vacancies 10 by bonding with oxygen in the metal oxide. The oxygen vacancies 10 may have a positive electric charge and may flow in the ferroelectric layer 120 along an electric field that results from a voltage applied to the gate electrode layer 140.

Referring to FIG. 3, a first writing voltage +V having a positive polarity may be applied to a gate electrode layer 140. At this time, a substrate 101 may be electrically grounded or connected to a power source having a relatively negative bias.

When the first writing voltage +V is applied to the gate electrode layer 140, a polarization orientation P1 may be formed in the ferroelectric layer 120 oriented in a direction from the gate electrode layer 140 toward the substrate 101. Electrons may be induced in a channel region 105 in the substrate 101 by the polarization orientation P1.

Meanwhile, the oxygen vacancies 10 having positive charges may migrate to an interface with a first oxygen barrier layer 110 in response to the electric field formed by the first writing voltage +V. However, the oxygen vacancies 10 may be inhibited or barred from passing through the first oxygen vacancy barrier layer 110, which has a low crystal defect concentration. Accordingly, the oxygen vacancies 10 may be inhibited from reacting with electrons induced in the channel region 105, such as by providing defect-driven pathways for electrons to migrate into the ferroelectric layer 120. As a result, it is possible to prevent or reduce the occurrence of a leakage current, and the subsequent deterioration of data retention during the operation of the ferroelectric memory device 1. The operational life of the ferroelectric memory device 1 might also be improved by limiting cyclic migration of oxygen vacancies in the ferroelectric layer 120.

Referring to FIG. 4, a second writing voltage −V having a negative polarity may be applied to the gate electrode layer 140. At this time, the substrate 101 may be electrically grounded or connected to a power source having a relatively positive bias.

When the second writing voltage −V is applied to the gate electrode layer 140, a polarization orientation P2 may be formed in the ferroelectric layer 120 oriented in a direction from the substrate 101 toward the gate electrode layer 140. Electrons may be ejected from the channel region 105 of the substrate 101 and/or holes may be induced into the channel region 105 by the polarization orientation P2.

Meanwhile, the oxygen vacancies 10 having positive polarity or charge may move towards an interface with the second oxygen barrier layer 130 under the influence of the electric field created by the second writing voltage −V. However, the oxygen vacancies 10 are inhibited or blocked from passing through the second oxygen vacancy barrier layer 130 having a low crystal defect concentration. Accordingly, the oxygen vacancies 10 cannot reach an interface with the gate electrode layer 140. As a result, it is possible to prevent or reduce the generation of a leakage current, and to inhibit or eliminate the deterioration of data retention or storage due to oxygen vacancy migration during the operation of the ferroelectric memory device 1. The operational life of the ferroelectric memory device 1 might also be improved by limiting cyclic migration of oxygen vacancies in the ferroelectric layer 120.

Figure 5:
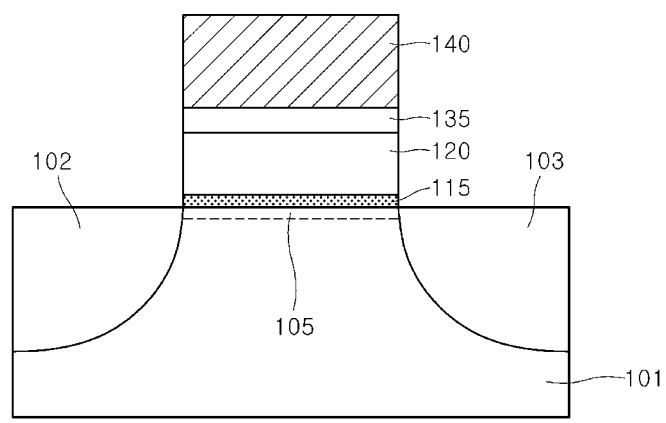
FIG. 5 is a cross-sectional view schematically illustrating a ferroelectric memory device according to another embodiment of the present disclosure.

FIG. 5 is a cross-sectional view schematically illustrating a ferroelectric memory device 2 according to another embodiment of the present disclosure. In the ferroelectric memory device 2 in FIG. 5, as compared to the ferroelectric memory device 1 described above and with reference to FIG. 1, the first oxygen vacancy barrier layer 110 of FIG. 1 is omitted.

Referring to FIG. 5, the ferroelectric memory device 2 may include an interfacial insulating layer 115, a ferroelectric layer 120, an oxygen vacancy barrier layer 135 and a gate electrode layer 140 that are sequentially stacked on a substrate 101.

The interfacial insulating layer 115 may include an amorphous insulating material. As an example, the interfacial insulating layer 115 may include silicon oxide, silicon nitride, and silicon oxynitride. In this embodiment, the interfacial insulating layer 115 may function to suppress or limit electron conduction or tunneling from the substrate 101 to the ferroelectric layer 120 during an operation of the ferroelectric memory device 2. In addition, the interfacial insulating layer 115 may prevent or reduce interfacial defects that may arise when the substrate 101 and the ferroelectric layer 120 are directly in contact with each other. Such interfacial defects may promote leakage current.

Furthermore, when a voltage having a negative bias is applied to the gate electrode layer 140, the oxygen vacancy barrier layer 135 can suppress or block the movement of the oxygen vacancies from inside the ferroelectric layer 120 to gate electrode layer 140. Specifically, the oxygen vacancy barrier layer 135 can prevent the oxygen vacancies in the ferroelectric layer 120 from reaching an interface between the ferroelectric layer 120 and the gate electrode layer 140. Thus, it is possible to prevent the oxygen vacancies collecting at the interface between the ferroelectric layer 120 and the gate electrode layer 140 from facilitating leakage current in ferroelectric memory device 2 in derogation of data retention or storage. The operational life of the ferroelectric memory device 2 might also be improved by limiting repeated re-distribution of oxygen vacancies in ferroelectric layer 120.

Figure 6:
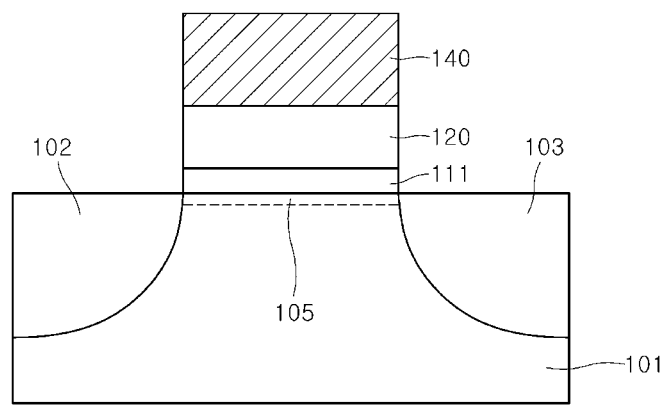
FIG. 6 is a cross-sectional view schematically illustrating a ferroelectric memory device according to another embodiment of the present disclosure.

FIG. 6 is a cross-sectional view schematically illustrating a ferroelectric memory device 3 according to another embodiment of the present disclosure. In the ferroelectric memory device 3 in FIG. 6, as compared to the ferroelectric memory device 1 described above with reference to FIG. 1, the second oxygen vacancy barrier layer 130 of FIG. 1 is omitted.

Referring to FIG. 6, the ferroelectric memory device 3 may include an oxygen vacancy barrier layer 111, a ferroelectric layer 120, and a gate electrode layer 140 that are sequentially stacked on a substrate 101.

As described above, the oxygen vacancy barrier layer 111 can stop or reduce oxygen vacancies in the ferroelectric layer 120 from moving to an interface with the substrate 101 in response to an applied voltage. Though this, it is possible to block or limit a leakage current augmented or made possible by the oxygen vacancies located adjacent to the substrate, such as by providing defect-driven pathways for electrons to migrate into the ferroelectric layer 120. Consequently, deterioration of data retention characteristics can be avoided or minimized.

As described above, the embodiments of the present disclosure disclose ferroelectric memory devices having a ferroelectric layer. In the ferroelectric memory devices, coercive electric fields $E_{coercive}$ or remanent polarization $P_r$ of various magnitudes can be achieved by managing dopants in the ferroelectric layer. However, oxygen vacancies, which are a kind of crystal defect, may be generated by dopant reactions, and when an external electric field is applied, the oxygen vacancies can move to an interface between the ferroelectric layer and a material layer that interfaces with the ferroelectric layer. At this time, the material layer is different in composition from the ferroelectric layer.

In embodiments of the disclosure, the ferroelectric memory device has at least one oxygen vacancy barrier layer, so that the oxygen vacancies in the ferroelectric layer can be prevented from moving to interface with the substrate or to interface with the gate electrode layer during operation of the ferroelectric memory device. Thus, it is possible to prevent an increase in the leakage current generated by the oxygen vacancies distributed at or close to the interface, and to prevent a decrease in the quality of information retention or storage. Further, it is possible to limit the effects of oxygen vacancies distributed at such interfaces on the operating life of the ferroelectric memory device. As a result, the operational reliability of the ferroelectric memory device can be improved.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A ferroelectric memory device comprising:
   a substrate;
   a ferroelectric layer and a gate electrode layer that are sequentially stacked on the substrate;
   a first oxygen vacancy barrier layer disposed between the substrate and the ferroelectric layer; and
   a second oxygen vacancy barrier layer disposed between the ferroelectric layer and the gate electrode layer,
   wherein each of the first and second oxygen vacancy barrier layers comprises a metal oxide with formula unit components that satisfy a stoichiometric ratio, and
   wherein each of the ferroelectric layer and the first and second oxygen vacancy barrier layers includes at least one dopant,
   wherein each of the first and second oxygen vacancy barrier layers and the ferroelectric layer comprise the same binary metal oxide,
   wherein the dopant of the ferroelectric layer has a valence different from a valence of a metal in the binary metal oxide, and the dopants of the first and second oxygen vacancy barrier layers have a valence equal to the valence of a metal contained in the binary metal oxide,
   wherein each of the ferroelectric layer and the first and second oxygen vacancy barrier layers includes oxygen vacancies, and
   wherein a concentration of the oxygen vacancies in each of the first and second oxygen vacancy barrier layers is lower than a concentration of the oxygen vacancies in the ferroelectric layer.

2. The ferroelectric memory device of claim 1, wherein the ferroelectric layer comprises a crystalline metal oxide.

3. The ferroelectric memory device of claim 2, wherein the crystalline metal oxide comprises hafnium oxide or zirconium oxide.

4. The ferroelectric memory device of claim 3, wherein the ferroelectric layer comprises a dopant having a valence of two (2) to three (3).

5. The ferroelectric memory device of claim 3, wherein the ferroelectric layer comprises at least one dopant selected from the group consisting of carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Gd), and lanthanum (La).

6. The ferroelectric memory device of claim 1, wherein the first and second oxygen vacancy barrier layers are ferroelectric.

7. The ferroelectric memory device of claim 1, wherein each of the first and second oxygen vacancy barrier layers comprises at least one of hafnium oxide, zirconium oxide, and titanium oxide.

8. The ferroelectric memory device of claim 1, wherein the gate electrode layer comprises at least one selected from the group consisting of tungsten (W), titanium (Ti), copper (Cu), aluminum (Al), platinum (Pt), iridium (Ir), ruthenium (Ru), tungsten nitride, titanium nitride, tantalum nitride, iridium oxide, ruthenium oxide, tungsten carbide, titanium carbide, tungsten silicide, titanium silicide, and tantalum silicide.

9. The ferroelectric memory device of claim 1,
   wherein the first oxygen vacancy barrier layer is disposed directly on the substrate and the ferroelectric layer is disposed directly on the first oxygen vacancy barrier layer.

10. A ferroelectric memory device comprising:
    a substrate;
    a ferroelectric metal oxide disposed on the substrate;
    a gate electrode layer disposed on the ferroelectric metal oxide;
    a first ferroelectric oxygen vacancy barrier layer disposed between the substrate and the ferroelectric metal oxide; and
    a second ferroelectric oxygen vacancy barrier layer disposed between the ferroelectric metal oxide and the gate electrode layer,
    wherein the ferroelectric metal oxide and the first and second ferroelectric oxygen vacancy barrier layers each comprise the same metal oxide,
    wherein each of the ferroelectric metal oxide and the first and second oxygen vacancy barrier layers includes at least one dopant,
    wherein the first and second oxygen vacancy barrier layers and the ferroelectric layer comprise the same binary metal oxide,
    wherein the dopant of the ferroelectric metal oxide has a valence different from a valence of a metal in the binary metal oxide, and the dopants of the first and second oxygen vacancy barrier layers have a valence equal to the valence of a metal contained in the binary metal oxide, wherein each of the ferroelectric layer and the first and second oxygen vacancy barrier layers includes oxygen vacancies, and wherein a concentration of the oxygen vacancies in each of the first and second oxygen vacancy barrier layers is lower than a concentration of the oxygen vacancies in the ferroelectric layer.

11. The ferroelectric memory device of claim 10, wherein the ferroelectric metal oxide comprises hafnium oxide or zirconium oxide.

12. The ferroelectric memory device of claim 11, wherein the ferroelectric metal oxide comprises a dopant having a valence of two (2) to three (3).

13. The ferroelectric memory device of claim 10, wherein the ferroelectric oxygen vacancy barrier layer comprises a crystalline metal oxide that satisfies the stoichiometric ratio, the crystalline metal oxide comprising at least one of hafnium oxide, zirconium oxide, and titanium oxide.

14. The ferroelectric memory device of claim 10, wherein the gate electrode layer comprises at least one selected from the group consisting of tungsten (W), titanium (Ti), copper (Cu), aluminum (Al), platinum (Pt), iridium (Ir), ruthenium (Ru), tungsten nitride, titanium nitride, tantalum nitride, iridium oxide, ruthenium oxide, tungsten carbide, titanium carbide, tungsten silicide, titanium silicide, and tantalum silicide.

15. The ferroelectric memory device of claim 10, further comprising a source region and a drain region disposed in the substrate at opposite ends of the gate electrode layer.

16. The ferroelectric memory device of claim 10,
wherein the first oxygen vacancy barrier layer is disposed directly on the substrate, and the ferroelectric metal oxide is disposed directly on the first oxygen vacancy barrier layer.

* * * * *